Figure 1:
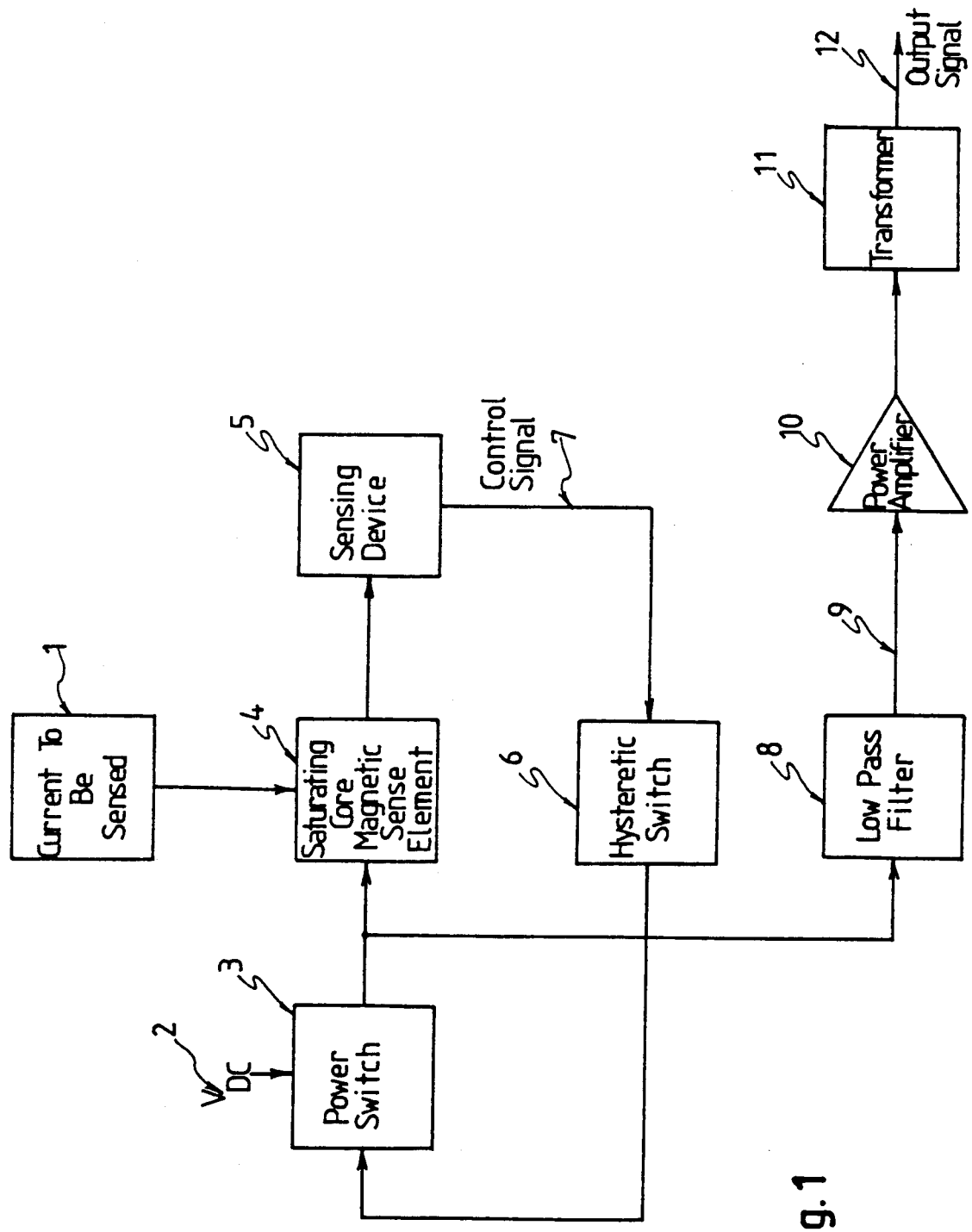

United States Patent [19]

Otto

[11] Patent Number: 5,008,612
[45] Date of Patent: Apr. 16, 1991

[54] CURRENT SENSOR

[75] Inventor: Donald V. Otto, Auckland, New Zealand

[73] Assignee: Unisearch Systems Limited, Pakuranga, New Zealand

[21] Appl. No.: 399,837

[22] Filed: Aug. 24, 1989

[30] Foreign Application Priority Data

Aug. 24, 1988 [NZ] New Zealand ............... 225931

[51] Int. Cl.$^5$ ............................................. G01R 33/00
[52] U.S. Cl. ..................................... 324/117 R; 324/126;
323/356; 323/357
[58] Field of Search ............... 324/127, 117 R, 126;
330/8; 323/355, 356, 357, 358; 336/212

[56] References Cited

U.S. PATENT DOCUMENTS

| | | | |
|---|---|---|---|
| 4,000,473 | 12/1976 | Saito et al. | 330/8 |
| 4,243,931 | 1/1981 | dela Cruz | 323/302 |
| 4,482,862 | 11/1984 | Leehey | 324/127 |
| 4,616,174 | 10/1986 | Jorgensen | 324/117 R |
| 4,841,236 | 6/1989 | Miljanic et al. | 324/127 |

FOREIGN PATENT DOCUMENTS

| | | |
|---|---|---|
| 0137347 | 4/1985 | European Pat. Off. |
| 0261707 | 3/1988 | European Pat. Off. |
| 0018207 | 1/1989 | Japan ............... 323/356 |

OTHER PUBLICATIONS

Patent Abstracts of Japan, vol. 2, No. 94 (E-78) (4521) Aug. 5, 1978 of JP-A-53 59821.

*Primary Examiner*—Kenneth Wieder
*Assistant Examiner*—Vinh P. Nguyen
*Attorney, Agent, or Firm*—Fleit, Jacobson, Cohn, Price, Holman & Stern

[57] ABSTRACT

A current sensing apparatus includes a first transformer having a core which is cyclically driven into forward and reverse saturation, and a second transformer having a separate core. The sensing apparatus includes circuitry for separating the sensed current component from the magnetizing current in the secondary winding of the first transformer. The apparatus may also include correction circuitry to cancel the effects of ripple current on the output due to both the magnetization current and errors due to the presence of the ripple cancellation circuitry itself. The present sensing apparatus provides electrical isolation between the primary circuit and the sensing circuit, has wide bandwidth, and is sensitive to temperature, temperature gradient, mechanical forces, aging (creep) and noise.

8 Claims, 3 Drawing Sheets

CURRENT SENSOR

The present invention relates to a current sensor utilising some aspects of the technology of fluxgate magnetometry. More particularly, but not exclusively, the present invention relates to a sensor utilising some aspects of the technology of fluxgate magnetometry having low sensitivity to environmental factors, a wide bandwidth and high accuracy.

Current sensors find common application in many power electronic systems. Desirable characteristics of current sensors are that they be linear, stable with respect to temperature and other environmental conditions, have good bandwidth (typically including DC and extending to a few megahertz), be small and light weight and give excellent performance for cost. It is also a desirable requirement that there be a high degree of isolation between primary and secondary circuits.

Hall effect or magnetoresistance sensors satisfy many or all of the above requirements. They, however, have a number of drawbacks relating to sensitivity, accuracy, bandwidth or cost or some combination of these.

The present invention aims to provide a sensor having at least some of the desirable characteristics mentioned above by utilising some aspects of the technology of fluxgate magnetometry. Fluxgate magnetometry allows the measurement of magnetic fields by utilising the nonlinear magnetic characteristics of ferromagnetic core materials. By maintaining a transformer in a state of oscillation very low frequency components (including DC) flowing in the primary winding can be measured in the secondary. It is an object of the present invention to provide current sensing apparatus capable of accurately measuring electric currents over a wide bandwidth, or to at least provide the public with a useful choice.

Further objects of the present invention will become apparent from the following description.

According to one aspect of the present invention there is provided apparatus for sensing currents comprising:

sensing means including a sensing transformer having a primary winding carrying a current to be sensed and a secondary winding, electrically isolated from the primary winding, magnetically linked to the primary winding by a magnetic core which is cyclically magnetised into saturation;

separating means for separating a cyclic current component from a sensed current component induced into the secondary winding from the primary winding;

switching means responsive to the cyclic current component to control cyclic saturation of the magnetic core; and processing means for processing the sensed current component to provide an output signal substantially proportional to the current to be sensed.

According to a further aspect of the present invention there is provided a method of obtaining a signal proportional to a current to be sensed comprising the steps of:

i. Cyclically driving the core of a sensing transformer into saturation;

ii. applying a current to be sensed to the primary winding of the sensing transformer;

iii. measuring the time d taken for the core to saturate in the positive direction;

iv. measuring the time d' taken for the core to saturate in the negative direction;

v. measuring the period P of the cyclic process;

vi. calculating the average value of the current to be sensed $I_{sense}$ according to the equation;

$I_{sense} = -n.Vg.[d-d']/P.R_1$ where $n.Vg$ is a constant./$R_1$

Further aspects of this invention, which should be considered in all its novel aspects, will become apparent from the following description given by way of example of possible embodiments thereof and in which reference is made to the accompanying drawings wherein:

FIG. 1 - shows a block diagram illustrating the logical operation of one form of current sensor.

Figure 2:
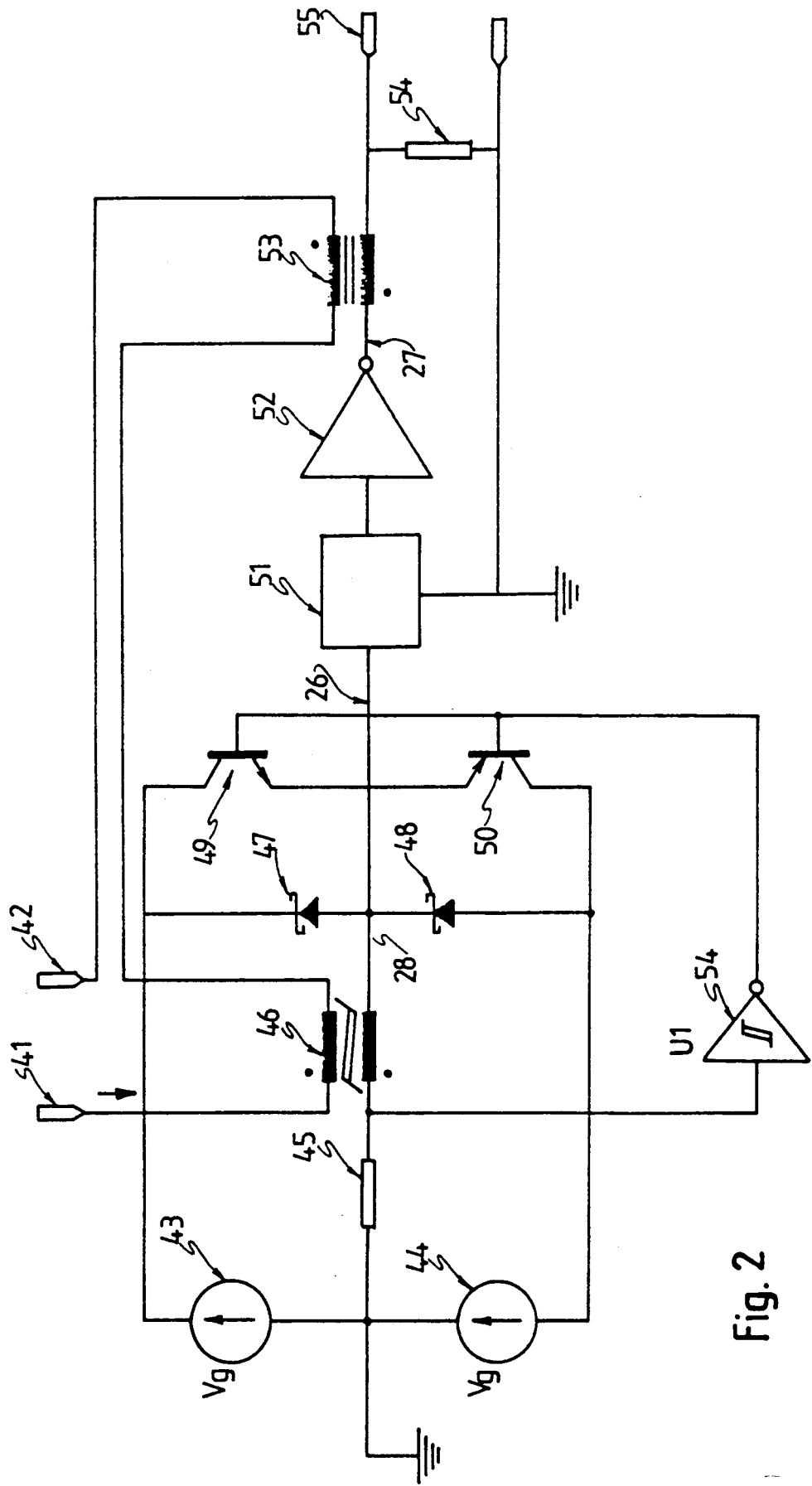

FIG. 2 - shows a circuit diagram of one possible implementation of the arrangement shown in FIG. 1.

Figure 3:
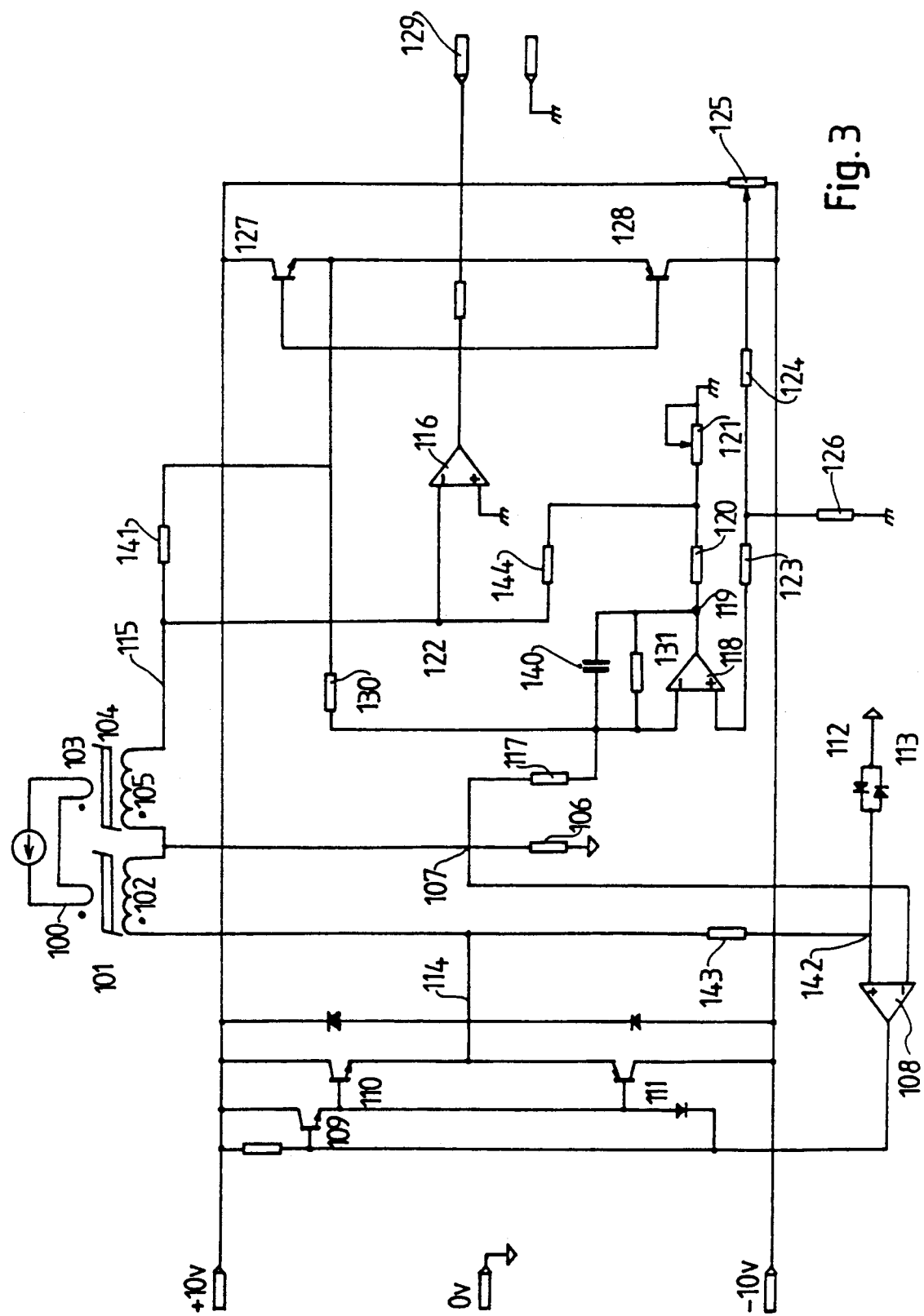

FIG. 3 - shows a preferred circuit implementation.

The present invention relates to a current sensor utilising a transformer as the sensing element, the core of which undergoes cyclic saturation. The current to be sensed flows through the primary winding and induces a current representative of the current to be sensed into the secondary winding. The secondary winding may carry a cyclic current which causes saturation of the core in cyclic fashion. Accordingly, the secondary winding of the transformer may carry two current components: the first being the magnetisation current related to the cyclic process and the second component being directly related to the current induced from the primary winding. Electronic and additional transformer means may be provided to substantially separate the two current components so that the cyclic process may be controlled by the cyclic component and the other component may be processed to provide an output signal which is related to the current flowing in the primary winding.

Such a configuration has the advantage that the primary circuit can be electrically isolated from the secondary circuit and the output signal is linearly related to the current flowing in the primary winding over a wide bandwidth. Depending upon the requirements of the sensor the bandwidth may include direct current and may extend to frequencies well above the frequency of the cyclic process. The above configuration also has the advantage of a very wide dynamic range.

Referring now to FIG. 1, a block diagram illustrating the logical arrangement of a sensing system is shown. The current to be sensed 1 passes through the primary winding of a saturating core magnetic sense element 4, which typically might be a small transformer with a soft ferrite toroidal core. The primary winding may merely consist of a single wire passing through the toroidal core. The secondary winding of this transformer may be connected at one end to a power switch 3 which may alternate the polarity of voltage of magnitude $V_{DC}$ supplied to the secondary winding from voltage source 2. The other end of the secondary winding may be connected to a sensing device 5, which can be simply a single resistor. The voltage developed across the resistor will contain two components: the first being that which is related to the cyclic current which magnetises the core of magnetic sense element 4 and the second being that which is related to the current induced into the secondary winding due to the current flowing in the primary winding.

If the power switch 3 initially has a positive polarity then the current flowing in the secondary winding of the sense element 4 will cause the core to saturate after a time which can be readily calculated by those skilled in the art. Upon saturation of the core the voltage across sensing device 5 will rise rapidly. The control signal 7 output from sensing device 5 can be applied to a hysteretic switch 6, such as a Schmitt trigger circuit, which may cause the power switch to change the polarity of the voltage applied across the secondary winding of the magnetic sense element when control signal 7 reaches a certain level. Due to the reverse polarity applied to the secondary winding the magnetisation of the core of the magnetic sense element is reduced and then begins to saturate in the opposite direction. Once the core saturates in this direction the voltage across sensing device 5 rises rapidly in the negative direction and via the hysteretic switch 6 the power switch may switch to a positive polarity so as to reverse the polarity of voltage applied to the secondary winding. Thus, the system described will continue to oscillate in a steady cyclic pattern.

The device essentially provides a transformer type of operation in which the average flux of the core of the magnetic sensing device is maintained at zero or near zero average. Because of this it is possible to accurately sense even direct currents.

An alternative method of maintaining cyclic oscillation would be to have a third winding, electrically isolated from the first to detect saturation of the core and reverse the polarity of voltage applied to the secondary winding when saturation is detected.

In order to obtain an output proportional to the input current, a low pass filter 8 may be connected to the output of the power switch 3 to remove most of the magnetising current component contamination. This signal at 9 will then accurately represent the low frequency end of the spectrum of frequencies present in the current to be sensed, including DC. In order to obtain the high frequency components further processing is necessary.

The magnetic sense element 4 is essentially a small current transformer operated in a near zero flux mode. Consequently, the secondary current will have present in it the high frequency components of the primary current up to the frequency limit of the transformer. This upper limit can be very high and in general depends as much upon the core material as upon the construction.

Thus, a second transformer 11, which may be similar to the first 4, connected appropriately will, if operated in the zero or near zero average flux mode, deliver an output current having a wide bandwidth including DC and having a cut off frequency much higher than the frequency of the cyclic process. To do this power amplifier 10 is required to provide an output current capacity somewhat greater than the maximum secondary current of transformer 11. Transformer 11 then develops its current into a suitable load, such as a resistor, across which the output signal 12 is developed and which is sized to ensure that the average voltage applied or developed across the secondary of transformer 11 is zero. With such a configuration, an output signal 12 may be obtained which is representative of both the high and low frequency components of the current to be sensed 1.

To further illustrate the operation of the arrangement shown in FIG. 1 reference is now made to FIG. 2 which shows a circuit diagram of one implementation of the arrangement of FIG. 1. The current to be sensed is supplied via terminals 41 and 42 and flows through the primary windings of transformers 46 and 53. Transformer 46 is a saturating core magnetic sense element and transformer 53 has similar characteristics to transformer 46.

Voltage sources 43 and 44 have a common connection to ground and via semi-conductor switches 49 and 50 supply voltages of the same magnitude but opposite polarity to the secondary winding of transformer 46. If, initially, semi-conductor switch 49 is on, then a voltage of positive magnitude $V_g$ will be supplied across the secondary winding of transformer 46 and resistor 45. Once the core of transformer 46 saturates the voltage across resistor 45 will increase rapidly. The voltage across resistor 45 may be supplied to a Schmitt trigger 54 to alternate the state of semi-conductor switches 49 and 50 when the voltage rises above a predetermined level. Thus, when the voltage across resistor 45 rises above a certain value the Schmitt trigger will switch semi-conductor switch 49 off and semi-conductor switch 50 on. A voltage of negative polarity and magnitude $V_g$ will then be supplied across the secondary winding of transformer 46 and resistor 45. The magnetisation of the core will then reduce and after a time saturate in the opposite direction. Once the core of transformer 46 is saturated, the voltage across resistor 45 will rise rapidly in the negative direction and thus Schmitt trigger 54 will alternate the states of semi-conductor switches 49 and 50. Thus, transformer 46 will continue to oscillate with the core thereof being driven into forward and reverse saturation.

Under this zero average core flux condition and with cyclic saturation of the core the current to be sensed flowing in the primary winding of transformer 46 will be induced into the secondary winding of transformer 46. In fact, currents flowing right down to DC in the primary winding of transformer 46 will be induced into the secondary winding of transformer 46. It can be noted that at DC or low frequencies the energy required to maintain the current in resistor 45 is derived principally from the voltage sources 43 and 44.

An analysis of FIG. 2 shows that if D is the ratio of time Q1 (transistor 49) is on to the period of the cyclic process and D' is the ratio of time Q2 (transistor 50) is on to the aforesaid period, and if n is the ratio of secondary turns to primary turns of the magnetic sense device, and if $I_{sense}$ is the current passing through the primary winding in the direction shown in FIG. 2 and $V_g$ is the value of the DC applied voltage shown in FIG. 2, then:

$$V_g[D - D'] = \frac{-R_1 \overline{I_{sense}}}{n}$$

The bar over $I_{sense}$ indicates that it is the current averaged over at least one complete cycle which this equation refers to. Thus the current to be sensed averaged over at least one cycle is proportional to [D-D']multiplied by various constants.

By passing the output at point 26 through a low pass filter 51 a voltage proportional to [D-D']is obtained and hence to the aforesaid average value of the primary current and the effects of the cyclic process made fairly small. By this means the output of the low pass filter is proportional to the low frequency part of the possible spectrum of frequencies present in the primary circuit current to be sensed.

Those skilled in the art will appreciate that the aforesaid low pass filter could alternatively be connected to point 28 between transformer 46 and resistor 45. It will further be appreciated that the aforementioned equation applies strictly only if the switching transistors are ideal. However, even with non-ideal switches, while the left hand side of the equation will be somewhat different, the right hand side remains the same and it is the right hand side which represents the principal output of the low pass filter.

Thus it will be appreciated that the combination of low pass filter 51, power amplifier 52 and transformer 53 with primary as shown in FIG. 2 so that the current to be sensed passes through it in the sense indicated, represents a means of separating the magnetising current component in the secondary winding of transformer 46 from the current to be sensed.

The output of low pass filter 51 may then be supplied to a power amplifier 52 which drives the output current through transformer 53 and across load resistor 54. For the low frequencies supplied from power amplifier 52, the secondary winding of transformer 53 is seen as a low impedance inductance and the majority of current is delivered across resistor 54. However, for the high frequency components of the current to be sensed, flowing in the primary of transformer 53, transformer 53 is seen as a high impedance and accordingly the high frequency components of the current to be sensed are induced into the secondary winding of transformer 53 and delivered across resistor 54 so that the output voltage has the high frequency components of the current to be sensed added to the low frequency components. Clearly, the characteristics of the low pass filter should ideally be compatible with the frequency response of the transformer 53 so that portions of the frequencies spectrum are not unduly attenuated or amplified. The filter 51 will preferably be an active Butterworth 3 or more pole filter with a pass band lower than the cyclic frequency of the sensor. Typically, the cyclic operating frequency will be about the range of 1 kHz to 20 kHz. However, other frequencies may be suitable in some applications.

Preferably, resistors 45 and 54 are of equal value so that approximately zero average voltage is applied to the secondary of transformer 53, thus resulting in the required zero average core flux operation.

Whilst the circuit shown in FIG. 2 operates quite well, its operation is less than optimum because the low pass filter does not permit transformer 53 to operate in a true zero average flux mode—especially under transient conditions such as might occur with a step change in the current to be sensed. Under this kind of condition the core of transformer 53 might saturate, thus resulting in distortion of the output signal 55. Further, it is not possible to completely eliminate the noise which appears in the output from the cyclic process. The filter invariably leaves a ripple on the output representative of the cyclic current.

Referring now to FIG. 3, the preferred circuit configuration is shown in which the aforementioned output ripple can be almost completely removed. The current to be sensed flows through the primary winding 100 of transformer 101 and through the primary winding 103 of transformer 104. In this circuit the magnetisation current component is separated from the sensed current component by transformer 104 and resistor 106. The voltage across resistor 106 is supplied to inverting terminal of comparator 108 to control the switching of semi-conductor devices 109, 110 and 111 to control the cyclic saturation of the core of transformer 101 in the usual way. Depending upon the polarity of the voltage output at 114 an offset voltage of the same polarity equal to the forward bias voltage across diode 112 and 113 will be supplied to the non-inverting terminal of comparator 108. This offset voltage may typically be plus 0.7 volts when the output at 114 is positive and minus 0.7 volts when the output at 114 is negative. This offset voltage assists in the clean switching of the cyclic process. It also makes the magnetising current ripple have approximately constant peak positive and negative values independent of the magnitude of the DC supply voltage.

Since the sensed current component is the same in each of the transformers 101 and 104 almost none of this current will appear in resistor 106 so that very nearly only the magnetising current component will flow in resistor 106. The voltage appearing across resistor 106 is the voltage which will excite the core of transformer 104 and since it is constrained to the limits set by the diodes 112 and 113 of the cyclic system this voltage will be fairly small compared with the cyclic voltage seen across the secondary winding 102 of transformer 101.

Further, since the magnetising current component appearing in the output current 115 is proportional to the voltage appearing across the secondary of transformer 104 and inversely proportional to the impedance of the secondary winding 105 of transformer 104 and since this impedance is typically of the order of about 1000 ohms, it follows that this component is quite small.

It will also be apparent to those skilled in the art that the diodes 112 and 113 and the fact that substantially only the magnetising current components flow in resistor 106, that the cyclic process is unaffected by the magnitude of the sensed current and that this can be an advantage.

Consequently, the current at 115 contains a ripple due to a portion of the magnetisation current flowing through the secondary winding 105 of transformer 104. To remove this ripple current the voltage from point 107 is supplied via resistor 117 to the inverting terminal of operational amplifier 118. Amplifier 118 is configured as an integrator with low frequency pole given by resistor 139 and capacitor 140 in parallel sized to emulate the similar pole formed by resistor 106 in series with the secondary inductance and secondary winding resistance of transformer 104. The output signal 119 is a voltage representative of the magnetising current component found at point 115 but shifted in phase by 180 degrees. Resistors connected between the output 119 and point 122 permit a current to flow between point 122 and output 119. The magnitude of this current can be adjusted by variable resistor 121 so that cancellation of the ripple on signal 115 is achieved at point 122. Point 122 is a virtual earth point maintained by operational amplifier 116. Resistors 123 to 126 are used for zeroing purposes.

Amplifier 116 is configured as a current to voltage converter with output at 127 and negative feedback being applied through resistor 141. In order to obtain a sufficient current capability in resistor 141, transistors 127 and 128 are configured as a common emitter amplifier. The current in resistor 141 more or less exactly matches the total current being the sum of currents at 115 and the current delivered from amplifier 118 to point 122. Because of the cancellation process, this current now has the ripple component virtually completely removed.

One further important error correction step has been taken in the circuit of FIG. 3 which will now be discussed. Due to the losses in the secondary winding of transformer 104 there is effectively a small resistance in series with secondary winding 105. As the frequency of the current to be sensed falls to DC this resistance causes a small error to appear in the output due to the voltage loss in the secondary winding 105 of transformer 104; such voltage being equal to the product of (secondary winding resistance)×(current to be sensed)/n. To compensate for this the turns ratio of transformer 101 is made slightly less by a factor of $(1-a)$. This gives rise to the injection of a current $a/n \times$(the current to be sensed) into resistor 106, where n is the turns ratio of the transformer. The value of a is equal to the ratio (resistance of secondary winding 105)/(value of resistor 106). This compensates for the voltage loss due to the resistance of the secondary winding of transformer 104. However, this leads to errors in the ripple correction circuitry and it is necessary to apply feedback via resistor 130 from the output 129 to the integrator. By the means described it is theoretically possible to almost ideally remove or cancel all ripple and other errors from the output.

It will be appreciated by those skilled in the art that the voltage across the secondary 102 of the saturable transformer 101 for example, in FIG. 2 will be reflected into the primary circuit. Because of this effect it is ordinarily possible only to utilise the current sensor in primary circuits which have sufficiently high impedance. However, it will be apparent that two identical sensors with primaries connected both in series and in phase opposition will cancel this effect provided the cyclic process is synchronised in both sensors. This is easily accomplished by having point 142 in FIG. 3 connected by a resistor having approximately the same value as 143 of FIG. 3 to the same point in the second sensor. The two sensors would have to have the same DC sources. Under these circumstances, the modified sensor can be used in low impedance circuits.

It will be further appreciate by those skilled in the art that economies could be provided by combining the switching circuits of both sensors into one.

It will further be appreciated by those skilled in the art that further economies could be achieved since the transformer corresponding to 105 in FIG. 3 along with all the ripple cancellation circuitry is not needed in the abovementioned second sensor provided electronic circuitry simulating the effect of transformer 104 on the resistor corresponding to resistor 106 shown in FIG. 3 is provided. Since a voltage corresponding exactly to the current to be sensed is available at output 129 in FIG. 3, This feature is readily accomplished using for example an electronic circuit for conversion of voltage to current for which a number of suitable configurations are known.

It is to be appreciated that any combination of the functional sections described may be utilised depending upon a particular application. Especially, the following functional sections may be applied to any particular current sensing apparatus separately or in combination:

I The use of a transformer (with a primary winding through which the current to be sensed passes) and resistor to separate the magnetisation current from the sensed current component. Such a combination may also include a primary winding which enables the high frequency components of the current to be sensed to be induced in the secondary winding.

II The use of a transformer with a primary winding through which the current to be sensed passes and low pass filter to separate the magnetisation current from the current to be sensed.

III Error correction means to remove the ripple due to the magnetisation current from the output representative of the current to be sensed. Such means may include means to shift the phase of the cyclic component by 180 degrees along with means for adding the phase shifted current component to the output of a current sensing circuit in appropriate magnitudes to cancel the ripple effect.

IV Reduction of the turns ratio of the magnetic sense element transformer to compensate for resistance losses across the secondary winding of a second transformer. When circuitry as set out in II above is employed it may also be necessary to include a feedback resistor from the output of the device to the integrator.

V Decoupling means for low impedance circuits to cancel the effects of reflection into the primary circuit by the magnetic sense element.

It will be appreciated by those skilled in the art that depending upon the particular application different combinations of the above elements may be suitable. It is to be understood that the invention is not limited to any particular one of the circuit realisations previously described and that these are given merely by way of example to illustrate the invention.

It has been found that by utilizing the techniques discussed above an accurate current sensor can be obtained which has a wide bandwidth, is insensitive to temperature, temperature gradients, mechanical forces, aging (creep) and noise.

Where in the foregoing description reference has been made to components or integers having known equivalents then such equivalents are herein incorporated as if individually set forth.

Although this invention has been described by way of example and with reference to possible embodiments thereof it is to be appreciated that improvements or modifications may be made to the invention without departing from the scope of the invention as defined in the appended claims.

What is claimed is:

1. Apparatus for sensing currents comprising:
   sensing means including first and second transformers each having a primary winding connected in series and defining a loop for carrying a current to be sensed and each having a secondary winding which is electrically isolated from the primary winding and a magnetic core for magnetically coupling the primary winding with the secondary winding;
   means for feeding the secondary winding of said first transformer with a cyclic magnetization current to cyclically drive the magnetic core of said first transformer into saturation;
   separating means for separating said cyclic magnetization current from a first sensed current component induced from said primary winding into the secondary winding of said first transformer;
   processing means for processing said first sensed current component together with a second sensed current component induced from said primary winding into the secondary winding of said second transformer to provide an output signal substantially proportional to the current to be sensed.

2. Apparatus as claimed in claim 1, wherein said secondary windings of said first and second transformers are connected in series to provide an output signal of said sensing means, said output signal being applied to one input of said processing means.

3. Apparatus as claimed in claim 2, wherein said separating means is connected to a common connection point of said secondary windings of said first and second transformers.

4. Apparatus as claimed in claim 3, wherein said separating means comprises a resistor connected between said common connection point and a point of substantially constant reference potential.

5. Apparatus as claimed in claim 2, wherein said processing means comprises error cancellation means for cancelling a ripple error on the output signal due to the cyclic magnetization current including means for phase shifting a signal derived from said cyclic current substantially 180 degrees and means for adding the output signal of said phase shifting means to the output signal of the sensing means.

6. Apparatus as claimed in claim 2, wherein the secondary winding of said first transformer has a lower turn ratio than that of said second transformer to compensate for resistance losses in said second transformer.

7. Apparatus as claimed in claim 6, and further comprising a feedback resistor for supplying the signal derived from said cyclic current to the input of said phase shifting means to compensate for the lesser number of turns in the secondary winding of said first transformer.

8. Apparatus as claimed in claim 1, wherein said separating means comprises a low pass filter connected between said secondary windings of said first and second transformers.

* * * * *